US012683576B2

(12) United States Patent
Takata

(10) Patent No.: US 12,683,576 B2
(45) Date of Patent: Jul. 14, 2026

(54) ACOUSTIC WAVE DEVICE AND MULTIPLEXER

(71) Applicant: Murata Manufacturing Co., Ltd., Nagaokakyo (JP)

(72) Inventor: Toshiaki Takata, Nagaokakyo (JP)

(73) Assignee: MURATA MANUFACTURING CO., LTD., Kyoto (JP)

( * ) Notice: Subject to any disclaimer, the term of this patent is extended or adjusted under 35 U.S.C. 154(b) by 201 days.

(21) Appl. No.: 18/783,377

(22) Filed: Jul. 24, 2024

(65) Prior Publication Data

US 2025/0070749 A1 Feb. 27, 2025

(30) Foreign Application Priority Data

Aug. 24, 2023 (JP) ................................. 2023-136255

(51) Int. Cl.
| | |
|---|---|
| *H03H 9/05* | (2006.01) |
| *H03H 9/02* | (2006.01) |
| *H03H 9/25* | (2006.01) |
| *H03H 9/64* | (2006.01) |
| *H03H 9/72* | (2006.01) |

(52) U.S. Cl.
CPC ...... *H03H 9/0561* (2013.01); *H03H 9/02866* (2013.01); *H03H 9/059* (2013.01); *H03H 9/25* (2013.01); *H03H 9/6483* (2013.01); *H03H 9/725* (2013.01)

(58) Field of Classification Search
CPC .. H03H 9/0561; H03H 9/02866; H03H 9/059; H03H 9/25; H03H 9/6483; H03H 9/725; H03H 9/205; H03H 9/706
See application file for complete search history.

(56) References Cited

U.S. PATENT DOCUMENTS

| | | | | |
|---|---|---|---|---|
| 8,896,089 | B2 * | 11/2014 | Chiu | H10W 70/635 |
| | | | | 257/E23.149 |
| 9,230,900 | B1 * | 1/2016 | Qian | H10W 70/635 |
| 2010/0207707 | A1 * | 8/2010 | Yata | H03H 9/6483 |
| | | | | 333/195 |
| 2013/0147505 | A1 * | 6/2013 | Wang | G01R 1/07342 |
| | | | | 324/755.01 |
| 2016/0142040 | A1 | 5/2016 | Yasuda | |

FOREIGN PATENT DOCUMENTS

| | | | | | |
|---|---|---|---|---|---|
| DE | 102017108105 | A1 * | 10/2017 | ........... | H03H 9/6433 |
| WO | WO-2007114390 | A1 * | 10/2007 | ........... | H03H 9/0576 |
| WO | WO-2013080461 | A1 * | 6/2013 | ........ | H03H 9/02834 |
| WO | 2015016203 | A1 | 2/2015 | | |

* cited by examiner

*Primary Examiner* — Andrea Lindgren Baltzell
*Assistant Examiner* — Kimberly E Glenn
(74) *Attorney, Agent, or Firm* — Keating & Bennett, LLP

(57) ABSTRACT

A filter includes a series arm resonator, parallel arm resonators, a multilayer substrate including main surfaces, a piezoelectric substrate, and a bump electrode on the piezoelectric substrate. Each of the parallel arm resonators include an IDT electrode on the piezoelectric substrate. The bump electrode is connected to the IDT electrode. The multilayer substrate includes a first planar electrode on a first of the main surfaces and bonded to the bump electrode, a second planar electrode on a second of the main surfaces and connected to a ground, and via conductors that connect the first and second planar electrodes. In a plan view of the first main surface, the bump electrode is between via conductors connected to the first planar electrode.

22 Claims, 9 Drawing Sheets

ACOUSTIC WAVE
PROPAGATION DIRECTION 58
54

57

68
67
66 ↑ ACOUSTIC WAVE
PROPAGATION DIRECTION

65

EMBODIMENT

COMPARATIVE EXAMPLE

ACOUSTIC WAVE DEVICE AND MULTIPLEXER

CROSS REFERENCE TO RELATED APPLICATIONS

This application claims the benefit of priority to Japanese Patent Application No. 2023-136255 filed on Aug. 24, 2023. The entire contents of this application are hereby incorporated herein by reference.

BACKGROUND OF THE INVENTION

1. Field of the Invention

The present invention relates to acoustic wave devices and multiplexers.

2. Description of the Related Art

International Publication No. 2015/016203 discloses a demultiplexing device (acoustic wave device) including a plurality of surface acoustic wave filters formed on a piezoelectric substrate, and a mounting substrate having a plurality of dielectric layers. A bump electrode disposed on the piezoelectric substrate is face-down bonded to a land electrode disposed on the mounting substrate. In this manner, a small acoustic wave device can be obtained.

However, in the acoustic wave device described in International Publication No. 2015/016203, there is an issue in that bandpass characteristics of the acoustic wave device deteriorate due to positional deviation between the bump electrode and the land electrode during face-down bonding.

SUMMARY OF THE INVENTION

Example embodiments of the present invention provide acoustic wave devices and multiplexers in each of which a deterioration in bandpass characteristics is reduced or prevented.

According to an example embodiment of the present invention, an acoustic wave device includes a first series arm resonator in a series arm path that connects a first input/output terminal and a second input/output terminal, a plurality of parallel arm resonators connected between the series arm path and a ground, a first substrate including a first main surface and a second main surface facing each other and a plurality of dielectric layers, a second substrate including a third main surface facing the first main surface, and a first bump electrode on the third main surface. The first series arm resonator includes a first functional electrode on the third main surface. A first parallel arm resonator of the plurality of parallel arm resonators includes a second functional electrode on the third main surface. The first bump electrode is connected to the second functional electrode. The first substrate includes a first planar electrode on a first dielectric layer of the plurality of dielectric layers and bonded to the first bump electrode, a second planar electrode on a second dielectric layer of the plurality of dielectric layers on a side of the second main surface with respect to the first dielectric layer and connected to the ground, and a plurality of via conductors connecting the first planar electrode and the second planar electrode. In a plan view of the first main surface, the first bump electrode is located between two via conductors of the plurality of via conductors connected to the first planar electrode. The first parallel arm resonator has a highest resonant frequency of the plurality of parallel arm resonators.

In addition, according to an example embodiment of the present invention, an acoustic wave device includes a first series arm resonator in a series arm path that connects a first input/output terminal and a second input/output terminal, a plurality of parallel arm resonators connected between the series arm path and a ground, a first substrate including a first main surface and a second main surface facing each other and a plurality of dielectric layers, a second substrate including a third main surface facing the first main surface, and a first bump electrode on the third main surface. The first series arm resonator includes a first functional electrode on the third main surface. A first parallel arm resonator of the plurality of parallel arm resonators includes a second functional electrode on the third main surface. The first bump electrode is connected to the second functional electrode. The first substrate includes a first planar electrode on a first dielectric layer of the plurality of dielectric layers and bonded to the first bump electrode, a second planar electrode on a second dielectric layer of the plurality of dielectric layers on a side of the second main surface with respect to the first dielectric layer and connected to the ground, and a plurality of via conductors connecting the first planar electrode and the second planar electrode. In a plan view of the first main surface, the first bump electrode is located between two via conductors of the plurality of via conductors connected to the first planar electrode. Each of the first functional electrode and the second functional electrode is an interdigital (IDT) electrode. The first parallel arm resonator has a smallest electrode finger pitch of the IDT electrode of the plurality of parallel arm resonators.

According to example embodiments of the present invention, it is possible to provide acoustic wave devices and multiplexers in each of which a deterioration in bandpass characteristics is reduced or prevented.

The above and other elements, features, steps, characteristics and advantages of the present invention will become more apparent from the following detailed description of the example embodiments with reference to the attached drawings.

DETAILED DESCRIPTION OF THE EXAMPLE EMBODIMENTS

Figure 1:
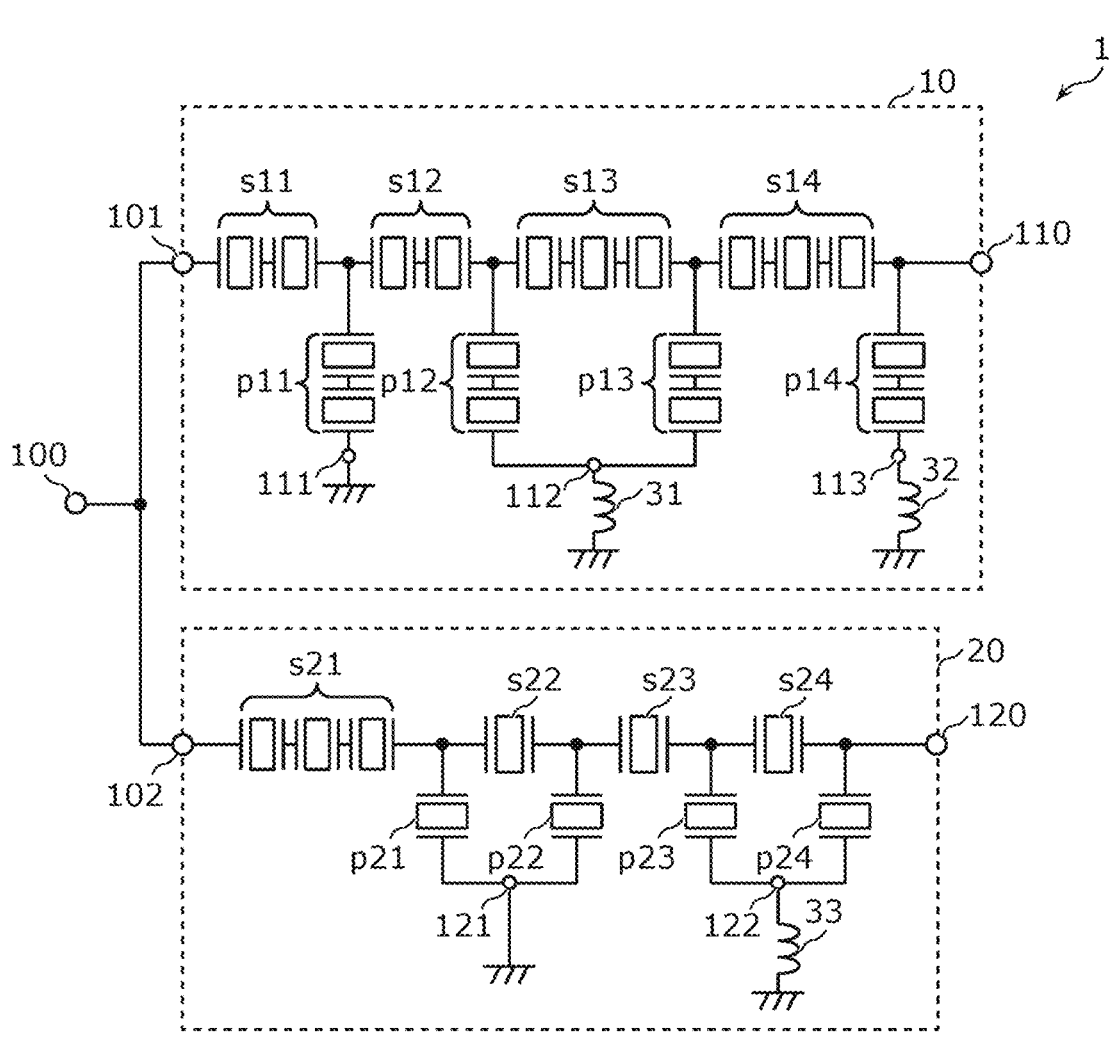
FIG. 1 is a circuit configuration diagram of a multiplexer according to an example embodiment of the present invention.

Hereinafter, example embodiments of the present disclosure will be described in detail with reference to the drawings. All of the example embodiments described below describe comprehensive or specific examples. For example, numerical values, shapes, materials, configuration elements, or dispositions and connection configurations of the elements which are described in the following example embodiments are merely examples, and are not intended to limit the present invention.

Each drawing is a schematic view in which emphasis, omission, or ratio adjustment may be made as appropriate to represent the present invention, and is not necessarily shown strictly. In some cases, a shape, a positional relationship, and a ratio may be different from actual ones. In the drawings, the same reference numerals the same or substantially the same configurations, and repeated description thereof may be omitted or simplified in some cases.

In a circuit configuration in the present disclosure, the description of "connected between A and B" or "being connected between A and B" means being connected to both A and B between A and B.

In addition, in a component disposition in the present disclosure, the description of "a component A is disposed in series in a path B" means that both a signal input end and a signal output end of the component A are connected to a wire, an electrode, or a terminal defining the path B.

In addition, terms representing a relationship between elements such as "parallel" and "perpendicular", terms representing a shape of an element such as "rectangular", and a numerical range not only represent strict meanings, but also mean a substantially equivalent range, for example, in which an error of approximately several percent is included.

In addition, in the component disposition in the present disclosure, the description of "a plan view of a main surface" means that an object is viewed in a state of being orthographically projected onto the main surface from a z-axis side. The description of "A is disposed between B and C" means that at least one of a plurality of line segments connecting any point inside B and any point inside C passes through A.

In addition, in the following example embodiments, a pass band of an acoustic wave device or a filter is defined as a frequency band between two frequencies which are, for example about 3 dB higher from a minimum value of an insertion loss inside the pass band.

In addition, in the present disclosure, a band A means a frequency band defined in advance by a standardization group or the like (for example, 3GPP (registered trademark) and the Institute of Electrical and Electronics Engineers (IEEE)) for a communication system constructed by using a Radio Access Technology (RAT). In example embodiments of the present invention, as the communication system, for example, a Long Term Evolution (LTE) system, a 5th Generation (5G)-New Radio (NR) system, a Wireless Local Area Network (WLAN) system, and the like can be used, but the present disclosure is not limited thereto.

In addition, an uplink operation band of the band A means a frequency range designated for uplink in the band A. In addition, a downlink operation band of the band A means a frequency range designated for downlink in the band A.

EXAMPLE EMBODIMENTS

1. Circuit Configuration of Multiplexer

FIG. 1 is a circuit configuration diagram of a multiplexer 1 according to an example embodiment of the present invention. The multiplexer 1 includes filters 10 and 20 and a common terminal 100.

The filter 10 is connected to a common terminal 100, and has a pass band including the uplink operation band of the band A, for example. The filter 20 is an example of an acoustic wave device, is connected to the common terminal 100, and has a pass band including the downlink operation band of the band A, for example. In the present example embodiment, the pass band of the filter 10 is located on a low frequency side with respect to the pass band of the filter 20.

For example, the band A is a band B3 for LTE or a band n3 for 5G-NR. The pass band of the filter 10 includes the uplink operation band (for example, about 1,710 MHz to about 1,785 MHz) of the band B3 or the band n3, and the pass band of the filter 20 includes the downlink operation band (for example, about 1,805 MHz to about 1,880 MHz) of the band B3 or the band n3.

As shown in FIG. 1, the filter 10 includes series arm resonators s11, s12, s13, and s14, parallel arm resonators p11, p12, p13, and p14, and inductors 31 and 32.

Each of the series arm resonators s11 to s14 is an acoustic wave resonator, and is disposed in a series arm path that connects an input terminal 110 and an output terminal 101. The parallel arm resonator p11 is an acoustic wave resonator, and is connected between a connection point of the series arm resonators s11 and s12 and a terminal 111. The parallel arm resonator p12 is an acoustic wave resonator, and is connected between a connection point of the series arm resonators s12 and s13 and a terminal 112. The parallel arm resonator p13 is an acoustic wave resonator, and is connected between a connection point of the series arm resonators s13 and s14 and the terminal 112. The parallel arm resonator p14 is an acoustic wave resonator, and is connected between a connection point of the series arm resonator s14 and the input terminal 110 and a terminal 113. The terminal 111 is connected to a ground without using an inductor interposed therebetween. The terminal 112 is connected to the ground with an inductor 31 interposed therebetween. The terminal 113 is connected to the ground with an inductor 32 interposed therebetween.

According to the above-described configuration, the filter 10 defines a ladder band pass filter.

Each of the series arm resonators s13 and s14 includes, for example, three division resonators connected in series, but may include one resonator. In addition, each of the series arm resonators s11 and s12 and the parallel arm resonators p11 to p14 includes, for example, two division resonators connected in series, but may include one resonator.

The filter 20 is an example of the acoustic wave device, and includes series arm resonators s21, s22, s23, and s24, parallel arm resonators p21, p22, p23, and p24, and an inductor 33.

Each of the series arm resonators s21 to s24 is a surface acoustic wave resonator or a bulk acoustic wave resonator, and is disposed in a series arm path that connects an input terminal 102 (first input/output terminal) and an output terminal 120 (second input/output terminal). Each of the series arm resonators s21 and s22 is an example of a first series arm resonator.

The parallel arm resonator p21 is an example of the first parallel arm resonator, and is connected between a connection point of the series arm resonators s21 and s22 and a terminal 121. The parallel arm resonator p22 is an example of a second parallel arm resonator, and is connected between a connection point of the series arm resonators s22 and s23 and the terminal 121. The parallel arm resonator p23 is an example of a third parallel arm resonator, and is connected between a connection point of the series arm resonators s23 and s24 and a terminal 122. The parallel arm resonator p24 is an example of the third parallel arm resonator, and is connected between a connection point of the series arm resonator s24 and the output terminal 120 and the terminal 122. Each of the parallel arm resonators p21 to p24 is a surface acoustic wave resonator or a bulk acoustic wave resonator. The terminal 121 is connected to the ground without using an inductor interposed therebetween. The terminal 122 is connected to the ground with the inductor 33 interposed therebetween.

According to the above-described configuration, the filter 20 defines a ladder band pass filter.

The series arm resonator s21 includes, for example, three division resonators connected in series, but may include one resonator. In addition, each of the series arm resonators s22 to s24 and the parallel arm resonators p21 to p24 includes, for example, one resonator, but may include two or more division resonators.

Table 1 shows a resonant frequency, an anti-resonant frequency, and electrostatic capacitance of the filter 20.

TABLE 1

| Filter 20 | Resonant Frequency (MHz) | Anti-Resonant Frequency (MHz) | Electrostatic Capacitance (pF) |
|---|---|---|---|
| Parallel Arm Resonator p21 | 1786 | 1854 | 1.33 |
| Parallel Arm Resonator p22 | 1775 | 1842 | 2.09 |
| Parallel Arm Resonator p23 | 1776 | 1847 | 1.73 |
| Parallel Arm Resonator p24 | 1778 | 1841 | 1.43 |

2. Basic Structure of Multiplexer

Figure 2:
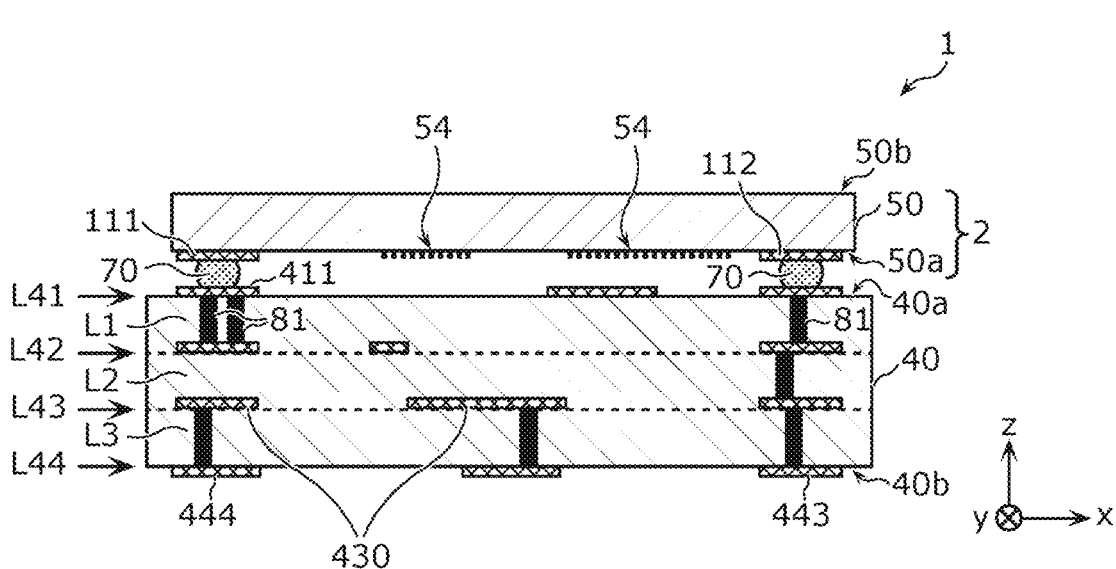
FIG. 2 is a cross-sectional view of a multiplexer according to an example embodiment of the present invention.
Figure 3:
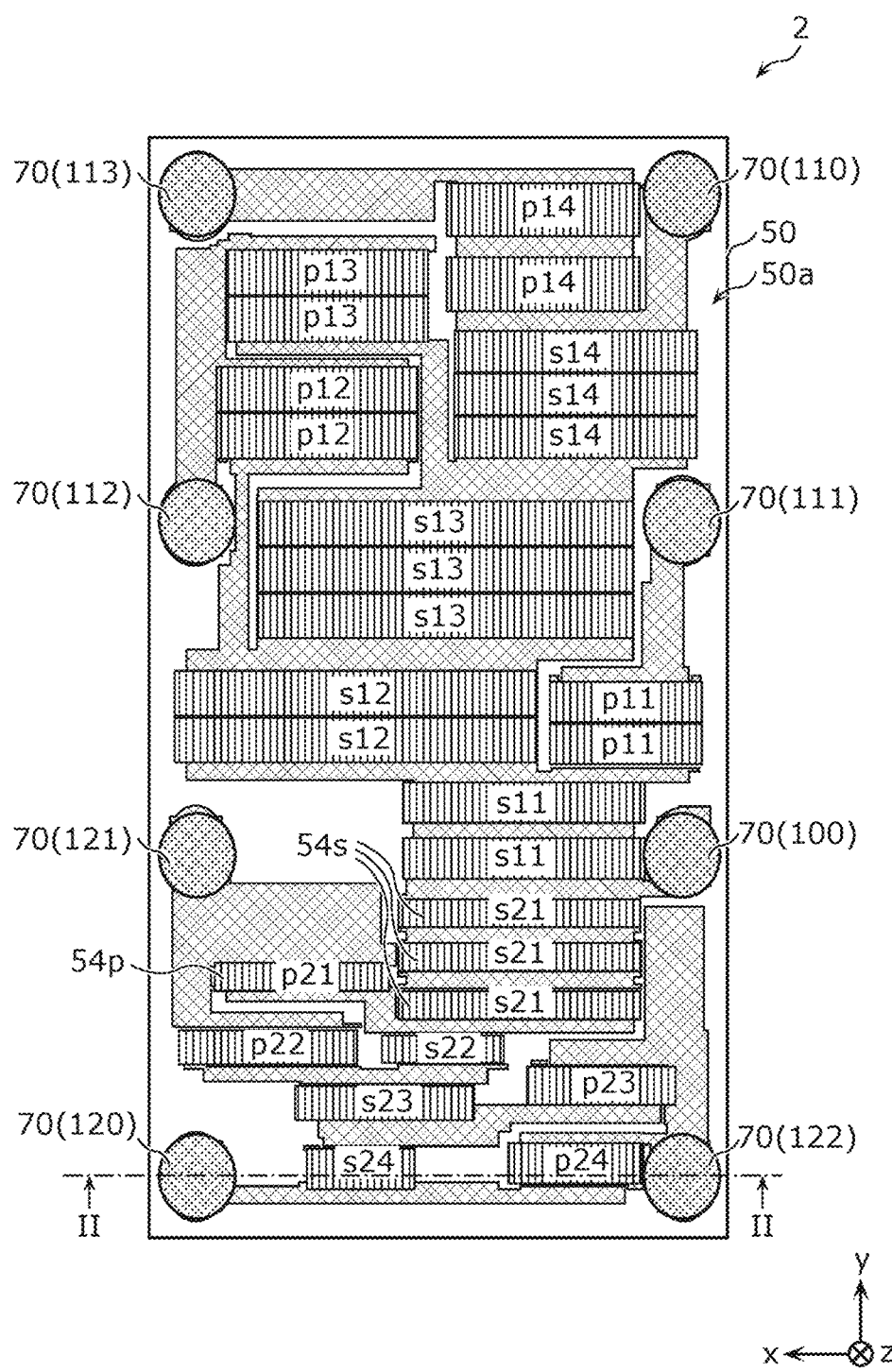
FIG. 3 is a plan view of a filter chip according to an example embodiment of the present invention.

FIG. 2 is a cross-sectional view of the multiplexer 1 according to the present example embodiment. In addition, FIG. 3 is a plan view of a filter chip 2 according to the present example embodiment. FIG. 2 is a cross-sectional view of the multiplexer 1 which is taken along line II-II in FIG. 3.

As shown in FIG. 2, the multiplexer 1 includes the filter chip 2 and a multilayer substrate 40. As shown in FIG. 3, the filter chip 2 includes a piezoelectric substrate 50, and an Interdigital transducer (IDT) electrode 54 (shown as s11 to s14, p11 to p14, s21 to s24, and p21 to p24 in FIG. 3), the common terminal 100, the input terminal 110, the output terminal 120, the terminals 111, 112, 113, 121, and 122, and a bump electrode 70. Each of the common terminal 100, the input terminal 110, the output terminal 120, the terminals 111, 112, 113, 121, and 122 is a planar electrode provided on a main surface 50a (third main surface) of the piezoelectric substrate 50.

In FIG. 3, the common terminal 100, the input terminal 110, the output terminal 120, and the terminals 111, 112, 113, 121, and 122 are not shown, but are disposed on a side in a z-axis positive direction of the bump electrode 70.

In addition, in FIGS. 3, 5, 6, 7A, and 7B, the bump electrode 70 bonded to the common terminal 100 is denoted as the bump electrode 70 (100), the bump electrode 70 bonded to the input terminal 110 is denoted as the bump electrode 70 (110), the bump electrode 70 bonded to the output terminal 120 is denoted as the bump electrode 70 (120), and the bump electrodes 70 bonded to each of the terminals 111, 112, 113, 121, and 122 are denoted as the bump electrodes 70 (111), 70 (112), 70 (113), 70 (121), and 70 (122).

In FIG. 3, the IDT electrode and the planar electrode which define the filter 10 are disposed above the filter chip 2 (on a side in a y-axis positive direction), and the IDT electrode and the planar electrode which define the filter 20 are disposed below the filter chip 2 (on a side in a y-axis negative direction).

In FIGS. 2 and 3, a case where each of the series arm resonators and each of the parallel arm resonators are the surface acoustic wave resonators is shown as an example. However, each of the series arm resonators and each of the parallel arm resonators may be, for example, bulk acoustic wave resonators. Detailed structures of the surface acoustic wave resonator and the bulk acoustic wave resonator will be described with reference to FIGS. 4A to 4C.

The piezoelectric substrate 50 is an example of a second substrate, and is a substrate including main surfaces 50a (third main surface) and 50b facing each other, and having piezoelectricity. A structural example of the piezoelectric substrate 50 will be described with reference to FIGS. 4A to 4C.

The multilayer substrate 40 is an example of the first substrate, and as shown in FIG. 2, includes main surfaces 40a and 40b facing each other, and includes a plurality of dielectric layers L1, L2, and L3. The multilayer substrate 40 is disposed such that the main surface 40a faces the main surface 50a. As the multilayer substrate 40, for example, a Low Temperature Co-Fired Ceramics (LTCC) substrate having a multilayer structure in the plurality of dielectric layers L1 to L3, a High Temperature Co-Fired Ceramics (HTCC) substrate, a component incorporated substrate, a substrate having a Redistribution Layer (RDL), or a printed substrate may be used.

The multilayer substrate 40 includes an electrode layer L41 which is a surface of the dielectric layer L1 on the side in the z-axis positive direction, an electrode layer L42 which is a surface of the dielectric layer L2 on the side in the z-axis positive direction, an electrode layer L43 which is a surface of the dielectric layer L3 on the side in the z-axis positive direction, and an electrode layer L44 which is a surface of the dielectric layer L3 on the side in the z-axis negative direction, from the main surface 40a toward the main surface 40b, and a conductor pattern including the planar electrode is provided on each of the electrode layers.

3. Basic Structure of Series Arm Resonator and Parallel Arm Resonator

Figure 4A:
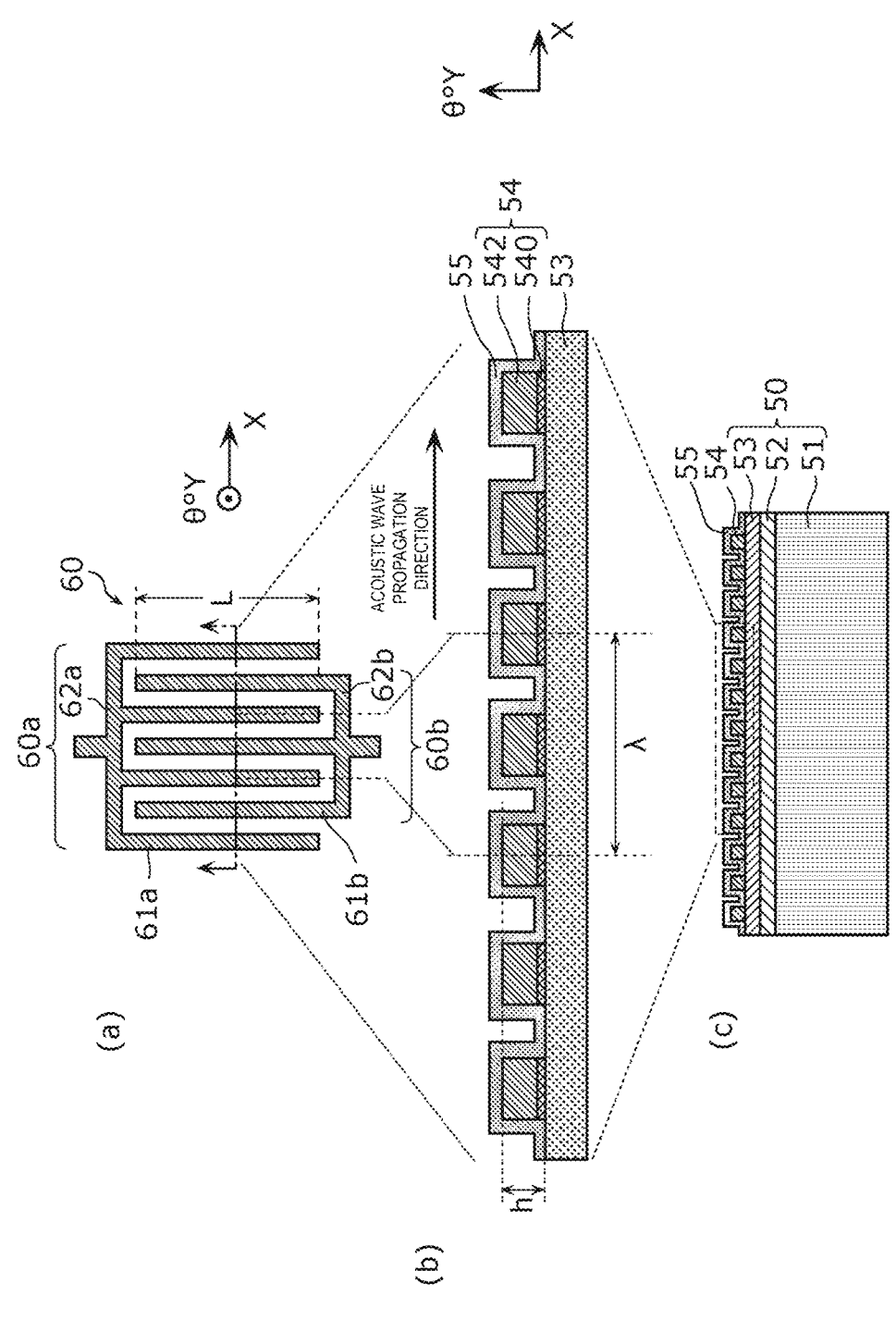
FIG. 4A is a plan view and a cross-sectional view which schematically show a first example of an acoustic wave resonator of a multiplexer according to an example embodiment of the present invention.

Next, a basic structure of each of the series arm resonators and each of the parallel arm resonators which define the multiplexer 1 will be described. FIG. 4A is a plan view and a cross-sectional view which schematically show a first example of the acoustic wave resonator of the multiplexer 1 according to the present example embodiment. FIG. 4A shows a basic structure of an acoustic wave resonator of the multiplexer 1. An acoustic wave resonator 60 shown in FIG. 4A is provided to describe a typical structure of the acoustic wave resonator of the multiplexer 1, and the number, a length, and the like of electrode fingers of the electrode are not limited thereto.

The acoustic wave resonator 60 includes the piezoelectric substrate 50 and comb electrodes 60a and 60b. As shown in (a) of FIG. 4A, a pair of the comb electrodes 60a and 60b facing each other are provided on the piezoelectric substrate 50. The comb electrode 60a includes a plurality of electrode fingers 61a parallel or substantially parallel to each other and a busbar electrode 62a that connects one end of each of the plurality of electrode fingers 61a to each other. In addition, the comb electrode 60b includes a plurality of electrode fingers 61b parallel or substantially parallel to each other and a busbar electrode 62b that connects one end of each of in the plurality of electrode fingers 61b to each other. The plurality of electrode fingers 61a and 61b extend along a direction orthogonal or substantially orthogonal to an acoustic wave propagation direction (X-axis direction). The busbar electrode 62a and the busbar electrode 62b are disposed to face each other with the electrode fingers 61a and 61b interposed therebetween. The comb electrodes 60a and 60b define an IDT electrode 54.

Here, when the filter 20 according to the present example embodiment performs electromechanical conversion by using a surface acoustic wave, the IDT electrode 54 is a functional electrode. The acoustic wave resonator 60 may include reflectors at both ends of the IDT electrode 54 in the acoustic wave propagation direction (X-axis direction).

As shown in (b) of FIG. 4A, for example, the IDT electrode 54 has a multilayer structure including a close contact layer 540 and a main electrode layer 542.

The close contact layer 540 is a layer to improve close contact between the piezoelectric substrate 50 and the main electrode layer 542, and for example, Ti is used as a material thereof. As a material of the main electrode layer 542, for example, Al including about 1% Cu is used. A protection layer 55 covers the comb electrodes 60a and 60b. The protection layer 55 is a layer to protect the main electrode layer 542 from an outside environment, to adjust frequency temperature characteristics, and to improve humidity resistance, and for example, is a dielectric film including silicon dioxide as a main component.

Materials of the close contact layer 540, the main electrode layer 542, and the protection layer 55 are not limited to the above-described materials. Furthermore, the IDT electrode 54 may have another structure other than the above-described multilayer structure. For example, the IDT electrode 54 may be made of metal such as Ti, Al, Cu, Pt, Au, Ag, and Pd, or an alloy, or may include a plurality of multilayer bodies made of the metal or the alloy described above. In addition, the protection layer 55 does not need to be provided.

Next, a multilayer structure of the piezoelectric substrate 50 will be described.

As shown in (c) of FIG. 4A, the piezoelectric substrate 50 includes a high acoustic velocity support substrate 51, a low acoustic velocity film 52, and a piezoelectric film 53 laminated in this order.

For example, the piezoelectric film 53 is made of a $\theta°$ Y-cut X propagation $LiTaO_3$ piezoelectric single crystal or piezoelectric ceramics (single crystal or ceramics through which the surface acoustic wave propagates in an X-axis direction, which is, for example, lithium tantalate single crystal or ceramics cut by a plane in which the X-axis is set as a central axis, and an axis rotated by $\theta°$ from the Y-axis is set as a normal line). A material and a cut-angle $\theta$ of the piezoelectric single crystal used as the piezoelectric film 53 are appropriately selected depending on required specifications of each filter.

The high acoustic velocity support substrate 51 supports the low acoustic velocity film 52, the piezoelectric film 53, and the IDT electrode 54. Furthermore, the high acoustic velocity support substrate 51 is a substrate in which the acoustic velocity of the bulk wave in the high acoustic velocity support substrate 51 is higher than the acoustic velocity of the acoustic wave of a surface acoustic wave or a boundary acoustic wave propagating through the piezoelectric film 53, and prevents a surface acoustic wave from leaking down from the high acoustic velocity support substrate 51 by confining the surface acoustic wave in a portion at which the piezoelectric film 53 and the low acoustic velocity film 52 are laminated. As a material of the high acoustic velocity support substrate 51, for example, a piezoelectric body such as aluminum nitride, lithium tantalate, lithium niobate, and crystal, ceramic such as alumina, sapphire, magnesia, silicon nitride, silicon carbide, zirconia, cordierite, mullite, steatite, forsterite, spinel, and sialon, a dielectric such as aluminum oxide, silicon oxynitride, diamond-like carbon (DLC), and diamond, or a semiconductor such as silicon, and alternatively, a material having the above-described materials as the main components can be used. The above-described spinel includes, for example, an aluminum compound including one or more elements selected from Mg, Fe, Zn, and Mn, and oxygen. Examples of the above-described spinel can include $MgAl_2O_4$, $FeAl_2O_4$, $ZnAl_2O_4$, and $MnAl_2O_4$.

The low acoustic velocity film 52 is a film in which the acoustic velocity of the bulk wave in the low acoustic velocity film 52 is lower than that of the bulk wave propagating through the piezoelectric film 53, and is disposed between the piezoelectric film 53 and the high acoustic velocity support substrate 51. This structure and a property that energy of an acoustic wave is concentrated on a medium having a low acoustic velocity reduce or prevent a possibility that surface acoustic wave energy leaks out from the IDT electrode 54. As a material of the low acoustic velocity film 52, for example, a dielectric such as a compound obtained by adding fluorine, carbon, or boron to glass, silicon oxide, silicon oxynitride, lithium oxide, tantalum oxide, and silicon oxide, or a material having the above-described materials as the main components can be used.

According to the above-described multilayer structure of the piezoelectric substrate 50, a Q value in a resonant frequency and an anti-resonant frequency can be significantly increased, compared to a structure in the related art in which the piezoelectric substrate is used as a single layer. That is, since the acoustic wave resonator having a large Q value can be provided, a filter having a small insertion loss can be provided by using the acoustic wave resonator.

The high acoustic velocity support substrate 51 may have a structure in which a support substrate and a high acoustic velocity film having the higher acoustic velocity of the propagating bulk wave than that of the acoustic wave such as the surface acoustic wave or a boundary acoustic wave propagating through the piezoelectric film 53 are laminated. In this case, as a material of the high acoustic velocity film, the same material as the material of the high acoustic velocity support substrate 51 can be used. As a material of the support substrate, for example, a piezoelectric body such as aluminum nitride, lithium tantalate, lithium niobate, and crystal, ceramic such as alumina, sapphire, magnesia, silicon nitride, silicon carbide, zirconia, cordierite, mullite, steatite, and forsterite, a dielectric such as diamond and glass, a semiconductor such as silicon and gallium nitride, or a resin, and alternatively, a material having the above-described materials as the main components can be used.

In the present specification, the "main component of the material" means a component in which a ratio occupied by the material exceeds 50% by weight. The main component may exist in any one state of single crystal, polycrystal, and amorphous, or in a mixed state thereof.

Figure 4B:
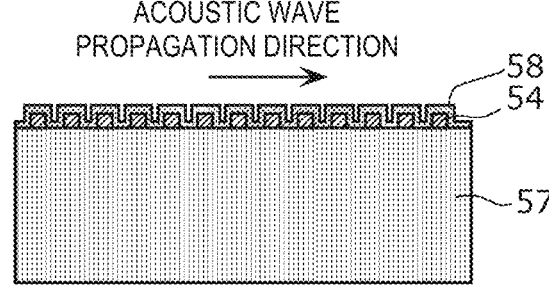
FIG. 4B is a cross-sectional view schematically showing a second example of an acoustic wave resonator of a multiplexer according to an example embodiment of the present invention.

FIG. 4B is a cross-sectional view schematically showing a second example of an acoustic wave resonator of the multiplexer 1 according to the present example embodiment. In the acoustic wave resonator 60 shown in FIG. 4A, an example in which the IDT electrode 54 is provided on the piezoelectric substrate 50 including the piezoelectric film 53 has been described. However, as shown in FIG. 4B, the substrate on which the IDT electrode 54 is provided may be a piezoelectric single crystal substrate 57 including a single layer of the piezoelectric body layer.

For example, the piezoelectric single crystal substrate 57 includes a piezoelectric single crystal of $LiNbO_3$. The acoustic wave resonator according to the present example includes, for example, the piezoelectric single crystal substrate 57 of $LiNbO_3$, the IDT electrode 54, and the protection layer 58 provided on the piezoelectric single crystal substrate 57 and on the IDT electrode 54.

The multilayer structure, the material, the cut-angle, and a thickness of the piezoelectric film 53 and the piezoelectric single crystal substrate 57 may be appropriately changed depending on required bandpass characteristics of the multiplexer 1 and the like. The acoustic wave resonator including the $LiTaO_3$ piezoelectric substrate or the like having another cut-angle other than the above-described cut-angle can achieve the same or substantially the same advantageous effects as those of the acoustic wave resonator 60 including the piezoelectric film 53 described above.

In addition, the piezoelectric substrate on which the IDT electrode 54 is provided may have a structure in which the support substrate, an energy confinement layer, and the piezoelectric film are laminated in this order. The IDT electrode 54 is provided on the piezoelectric film. As the piezoelectric film, for example, the $LiTaO_3$ piezoelectric single crystal or the piezoelectric ceramics can be used. The support substrate supports the piezoelectric film, the energy confinement layer, and the IDT electrode 54.

The energy confinement layer includes one layer or a plurality of layers, and the velocity of the bulk acoustic wave propagating through the at least one layer is higher than the velocity of the acoustic wave propagating in the vicinity of the piezoelectric film. For example, the energy confinement layer may have a multilayer structure including the low acoustic velocity layer and the high acoustic velocity layer. The low acoustic velocity layer is a film in which the acoustic velocity of the bulk wave in the low acoustic velocity layer is lower than the acoustic velocity of the acoustic wave propagating through the piezoelectric film.

The high acoustic velocity layer is a film in which the acoustic velocity of the bulk wave in the high acoustic velocity layer is higher than the acoustic velocity of the acoustic wave propagating through the piezoelectric film. The support substrate may be used as the high acoustic velocity layer.

In addition, the energy confinement layer may be an acoustic impedance layer having a configuration in which a low acoustic impedance layer having a relatively low acoustic impedance and a high acoustic impedance layer having a relatively high acoustic impedance are alternately laminated.

Here, electrode parameters of the IDT electrode defining the acoustic wave resonator 60 will be described.

A wavelength of the acoustic wave resonator is defined by a wavelength $\lambda$ that is a repeating period in the plurality of electrode fingers 61a or 61b forming the IDT electrode 54 shown in (b) of FIG. 4A. In addition, an electrode finger pitch is ½ of the wavelength $\lambda$, and when a line width of the electrode fingers 61a and 61b defining each of the comb electrodes 60a and 60b is defined as W, and a space width between the electrode finger 61a and the electrode finger 61b which are adjacent to each other is defined as S, the electrode finger pitch is defined as (W+S).

In the IDT electrode 54, when an interval between the adjacent electrode fingers is not constant, the electrode finger pitch of the IDT electrode 54 is defined as an average electrode finger pitch of the IDT electrode 54. The average electrode finger pitch of the IDT electrode 54 is defined as $Di/(Ni-1)$, when the total number of the electrode fingers 61a and 61b included in the IDT electrode 54 is defined as Ni, and when a distance between centers of the electrode finger located in one end and the electrode finger located in the other end of the IDT electrode 54 in the acoustic wave propagation direction is defined as Di.

Figure 4C:
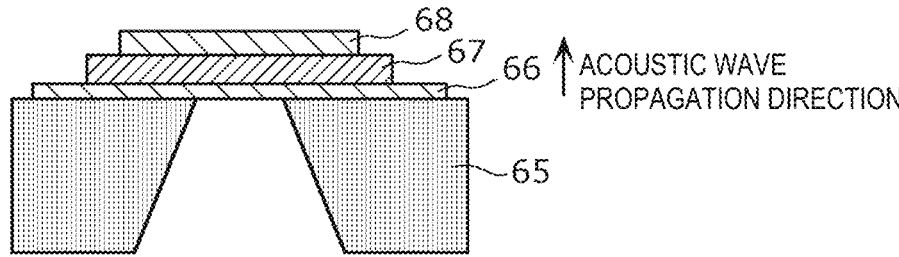
FIG. 4C is a cross-sectional view schematically showing a third example of an acoustic wave resonator of a multiplexer according to an example embodiment of the present invention.

In addition, FIG. 4C is a cross-sectional view schematically showing a third example of an acoustic wave resonator of the multiplexer 1 according to the present example embodiment. FIG. 4C shows a bulk acoustic wave resonator as the acoustic wave resonator of the multiplexer 1. As shown in the drawing, for example, the bulk acoustic wave resonator includes a support substrate 65, a lower electrode 66, a piezoelectric body layer 67, and an upper electrode 68 laminated in this order.

The support substrate 65 supports the lower electrode 66, the piezoelectric body layer 67, and the upper electrode 68, and is a silicon substrate, for example. In the support substrate 65, a cavity is provided in a region that comes into contact with the lower electrode 66. In this manner, the piezoelectric body layer 67 can freely vibrate.

The lower electrode 66 is an example of a third planar electrode, and is provided on one surface of the support substrate 65. The upper electrode 68 is an example of a fourth planar electrode, and is provided on one surface of the support substrate 65. As materials of the lower electrode 66 and the upper electrode 68, for example, Al including about 1% Cu is used.

The piezoelectric body layer 67 is an example of a piezoelectric thin film, and is provided between the lower electrode 66 and the upper electrode 68. For example, the piezoelectric body layer 67 includes at least one of zinc oxide (ZnO), aluminum nitride (AlN), lead zirconate titanate (PZT), potassium niobate (KN), lithium niobate (LN), lithium tantalate (LT), crystal, and lithium borate (LiBO) as the main component.

The bulk acoustic wave resonator having the above-described multilayer configuration induces the bulk acoustic wave inside the piezoelectric body layer 67, and generates resonance by applying electric energy between the lower electrode 66 and the upper electrode 68. The bulk acoustic wave generated by the bulk acoustic wave resonator propagates between the lower electrode 66 and the upper electrode 68 in a direction perpendicular or substantially perpendicular to a film surface of the piezoelectric body layer 67. That is, the bulk acoustic wave resonator is a resonator using the bulk acoustic wave.

Here, when the filter 20 according to the present example embodiment performs electromechanical conversion by using the bulk acoustic wave, the lower electrode 66, the piezoelectric body layer 67, and the upper electrode 68 are functional electrodes. In addition, the support substrate 65 may be a first substrate instead of the piezoelectric substrate 50.

4. Bonding Structure Between Filter Chip and Multilayer Substrate

Next, a bonding structure between the filter chip 2 and the multilayer substrate 40 will be described with reference to FIGS. 3 and 5 to 7B.

As shown in FIG. 3, in the filter chip 2, the parallel arm resonator p21 (first parallel arm resonator) includes a portion of the piezoelectric substrate 50 and an IDT electrode 54p. The IDT electrode 54p is an example of a second functional electrode, and is one of the IDT electrodes 54. In addition, the series arm resonator s21 (first series arm resonator) includes another portion of the piezoelectric substrate 50 and an IDT electrode 54s. The IDT electrode 54s is an example of the first functional electrode, and is one of the IDT electrodes 54.

The output terminal 101 and the input terminal 102 which are shown in FIG. 1 include the same or substantially the same planar electrode as the common terminal 100 on the main surface 50a. The bump electrode 70 is bonded to each of the common terminal 100, the input terminal 110, the output terminal 120, the terminals 111, 112, 113, 121, and 122. As shown in FIG. 3, the bump electrode 70 (121) is an example of the first bump electrode, and is connected to the IDT electrode 54p.

Figure 5:
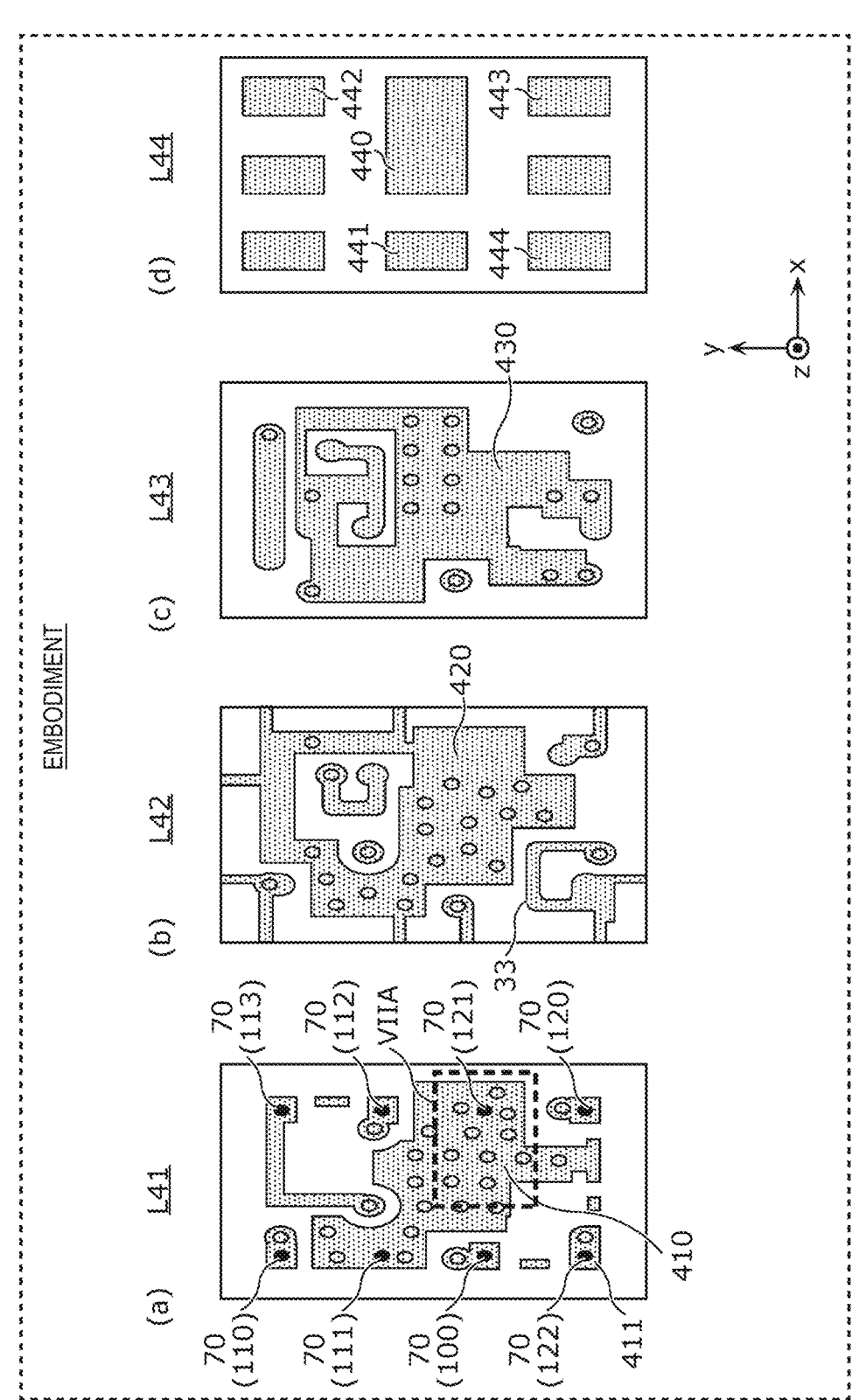
FIG. 5 is a plan view of each layer of a multilayer substrate of a multiplexer according to an example embodiment of the present invention.

FIG. 5 is a plan view of each layer of the multilayer substrate 40 of the multiplexer 1 according to the present example embodiment. As shown in FIG. 5, the multilayer substrate 40 includes planar electrodes 410, 420, 430, 440, 441, 442, 443, and 444, and a plurality of via conductors 81. A circle (○) shown in (a) to (c) of FIG. 5 represents a via conductor 81 that penetrates from a surface on the main surface 40a side to a surface on the main surface 40b side in any of the dielectric layers L1 to L3.

An electrode layout of the electrode layer L41 provided on the surface of the dielectric layer L1 on the main surface 40a side is shown in (a) of FIG. 5. The bump electrode 70 provided in the filter chip 2 is bonded to the planar electrode of the electrode layer L41. The planar electrode 410 provided on the electrode layer L41 is an example of the first planar electrode, and is bonded to the bump electrodes 70 (121) and 70 (111). The planar electrode 410 to which the bump 70 (121) is connected is connected to the planar electrode 420 of the electrode layer L42 which is a lower layer of the electrode layer L41 by the plurality of via conductors 81.

An electrode layout of the electrode layer L42 provided on the surface of the dielectric layer L2 on the main surface 40a side is shown in (b) of FIG. 5. The planar electrode 420 is connected to the planar electrode 430 of the electrode layer L43 which is the lower layer of the electrode layer L42 by the plurality of via conductors 81.

An electrode layout of the electrode layer L43 provided on the surface of the dielectric layer L3 on the main surface 40a side is shown in (c) of FIG. 5. The planar electrode 430 is connected to the planar electrode 440 of the electrode layer L44 which is the lower layer of the electrode layer L43 by the plurality of via conductors 81.

An electrode layout of the electrode layer L44 provided on the surface of the dielectric layer L3 on the main surface 40b side is shown in (d) of FIG. 5. The planar electrode 440 provided on the electrode layer L44 is an example of a second planar electrode, is connected to the planar electrode 430 provided on the electrode layer L43 with the plurality of via conductors 81 interposed therebetween, and is connected to the ground. In addition, the planar electrode 441 provided on the electrode layer L44 is connected to the bump electrode 70 (100) of the electrode layer L41 with the electrode layers L42 and L43 interposed therebetween. In addition, the planar electrode 442 provided on the electrode layer L44 is connected to the bump electrode 70 (110) of the electrode layer L41 with the electrode layers L42 and L43 interposed therebetween. In addition, the planar electrode 443 provided on the electrode layer L44 is connected to the bump electrode 70 (120) of the electrode layer L41 with the electrode layers L42 and L43 interposed therebetween. In addition, the planar electrode 444 provided on the electrode layer L44 is connected to the bump electrode 70 (122) of the electrode layer L41 with the electrode layers L42 and L43 interposed therebetween. The planar electrodes 440, 441, 442, 443, and 444 provided on the electrode layer L44 are external connection terminals for connecting the multiplexer 1 to an external substrate disposed to face the main surface 40b.

The number of the via conductors 81 connecting the planar electrode 410 and the planar electrode 420 is largest in the numbers of the via conductors 81 connecting one planar electrode of the electrode layer L41 and one planar electrode of the electrode layer L42. In this manner, an inductor component between the planar electrode 410 and the planar electrode 420 can be reduced.

In addition, the number of the via conductors 81 connecting the planar electrode 420 and the planar electrode 430 is largest in the numbers of the via conductors 81 connecting one planar electrode of the electrode layer L42 and one planar electrode of the electrode layer L43. In this manner, the inductor component between the planar electrode 420 and the planar electrode 430 can be reduced.

In addition, the number of the via conductors 81 connecting the planar electrode 430 and the planar electrode 440 is largest in the numbers of the via conductors 81 connecting one planar electrode of the electrode layer L43 and one planar electrode of the electrode layer L44. In this manner, the inductor component between the planar electrode 430 and the planar electrode 440 can be reduced.

According to these configurations, the inductor component from the planar electrode 440 which is the external connection terminal to the bump 70 (121) can be reduced, and as a result, steepness of filter characteristics can be improved.

The planar electrode 410 bonded to the bump electrode 70 (121) does not need to be disposed on the electrode layer L41 which is an outermost layer of the multilayer substrate 40, and may be disposed on the first dielectric layer in the plurality of dielectric layers L1 to L3 in which the planar electrode is provided. The planar electrode 440 does not need to be disposed on the electrode layer L44 which is the outermost layer of the multilayer substrate 40, and may be disposed on the second dielectric layer on the main surface 40$b$ side with respect to the first dielectric layer in the plurality of dielectric layers L1 to L3 in which the planar electrode is provided.

Figure 6:
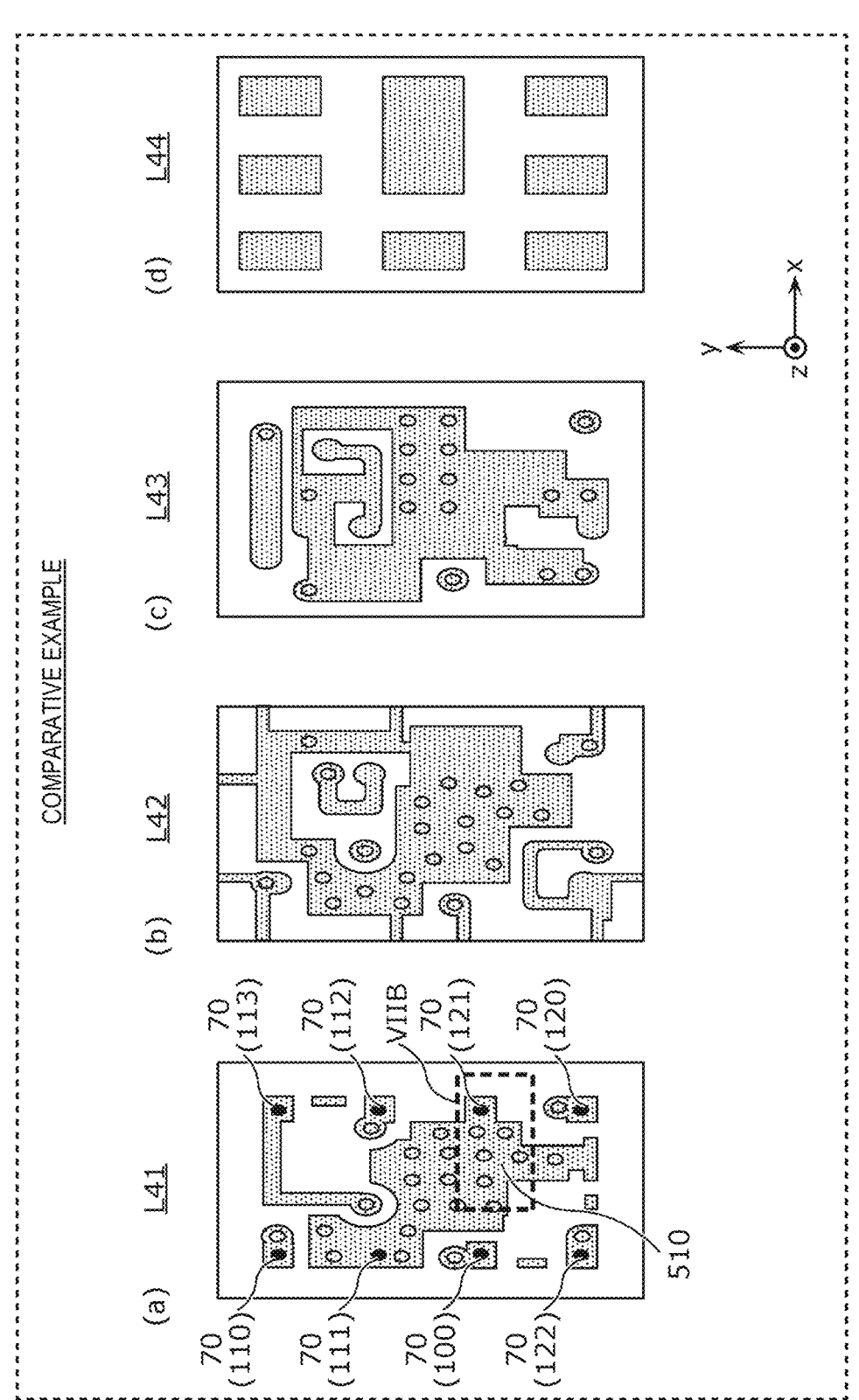
FIG. 6 is a plan view of each layer of a multilayer substrate of a multiplexer according to a comparative example.

FIG. 6 is a plan view of each layer of the multilayer substrate 40 of a multiplexer according to a comparative example. The multiplexer according to the comparative example is different from the multiplexer 1 according to the example embodiment only in that the planar electrode 410 of the electrode layer L41 is replaced with a planar electrode 510.

An electrode layout of the electrode layer L41 is shown in (a) of FIG. 6. The bump electrode 70 provided in the filter chip 2 is bonded to the planar electrode of the electrode layer L41. The planar electrode 510 provided on the electrode layer L41 is bonded to the bump electrodes 70 (121) and 70 (111). Each electrode layout in (b) to (d) of FIG. 6 is the same or substantially the same as each electrode layout in (b) to (d) of FIG. 5.

Figure 7A:
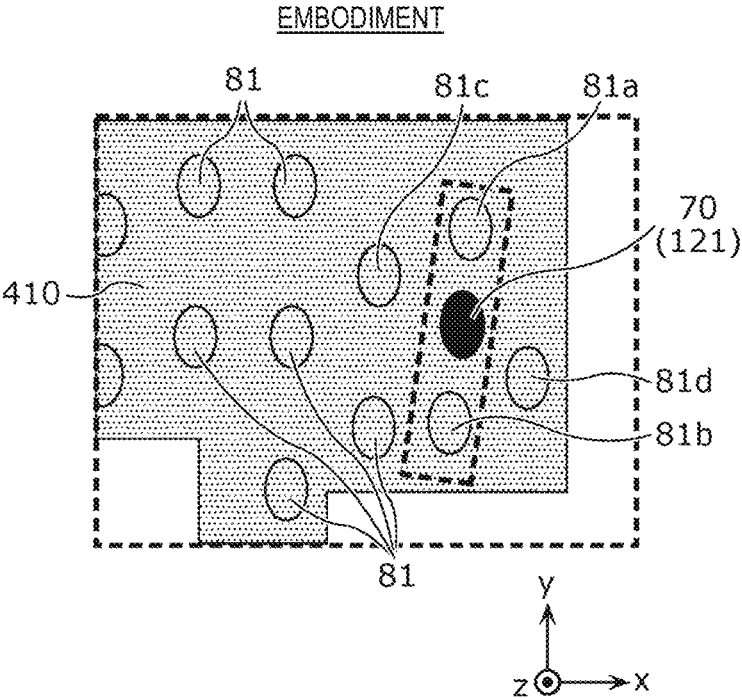
FIG. 7A is an enlarged plan view of a first layer of a multilayer substrate according to an example embodiment of the present invention.
Figure 7B:
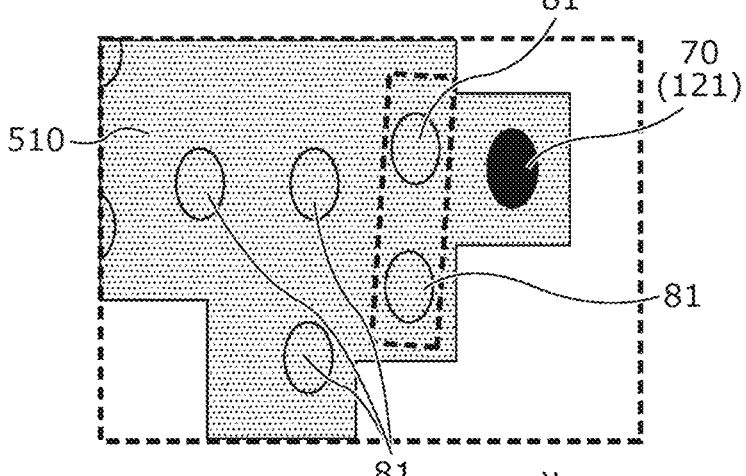
FIG. 7B is an enlarged plan view of a first layer of a multilayer substrate according to a comparative example.

FIG. 7A is an enlarged plan view of the electrode layer L41 of the multilayer substrate 40 according to the present example embodiment. In addition, FIG. 7B is an enlarged plan view of the electrode layer L41 of the multilayer substrate according to the comparative example. FIG. 7A is an enlarged plan view of a region VIIA in (a) of FIG. 5, and FIG. 7B is an enlarged plan view of a region VIIB in (a) of FIG. 6.

Here, as shown in FIG. 7A, in the filter 20 according to the present example embodiment, in a plan view of the main surface 40$a$, the bump electrode 70 (121) is located between two via conductors 81$a$ and 81$b$ in the plurality of via conductors 81 connected to the planar electrode 410. The bump electrode 70 (121) is connected between the parallel arm resonator p21 of the filter 20 and the ground. As shown in Table 1, the parallel arm resonator p21 has a highest resonant frequency in the plurality of parallel arm resonators of the filter 20. The plurality of parallel arm resonators of the filter 20 are parallel arm resonators that contribute to providing a pass band of the filter 20, and are specifically defined as parallel arm resonators in which the anti-resonant frequency is located inside the pass band of the filter 20.

In addition, the parallel arm resonator p21 has the highest resonant frequency in the plurality of parallel arm resonators of the filter 20, in other words, the parallel arm resonator p21 has a smallest electrode finger pitch of the IDT electrode in the plurality of parallel arm resonators of the filter 20.

In the ladder acoustic wave filter, when parasitic inductance is generated in a path that connects the parallel arm resonator and the ground, the resonant frequency of the parallel arm resonator varies. When the electrostatic capacitance of the parallel arm resonator is defined as Cp and the parasitic inductance is defined as Lp, the resonant frequency ($=1/2\pi\sqrt{(LpCp)}$) of the parallel arm resonator varies to a low frequency side as the parasitic inductance Lp increases, and an interval between the resonant frequency and the anti-resonant frequency is widened. In this manner, an attenuation slope on the low frequency side of the pass band is reduced, and an attenuation in the vicinity of the low frequency side of the pass band deteriorates. In particular, the parallel arm resonator having the highest resonant frequency in the plurality of parallel arm resonators of the acoustic wave filter determines the attenuation and the steepness in the vicinity of the low frequency side of the pass band. Therefore, when the resonant frequency of the parallel arm resonator having the highest resonant frequency varies to the low frequency side, attenuation characteristics in the vicinity of the low frequency side of the pass band of the acoustic wave filter greatly deteriorate. In the multiplexer 1 and the filter 20 according to the present example embodiment, an intentional inductor is not connected between the parallel arm resonator p21 having the highest resonant frequency in the plurality of parallel arm resonators and the ground. The intentional inductor includes a chip-shaped inductor and an inductor including a conductor coil provided on the electrode layer of the multilayer substrate.

In the multiplexer according to the comparative example, as shown in FIG. 7B, in a plan view of the main surface 40$a$, the bump electrode 70 (121) is not located between two via conductors 81 in the plurality of via conductors 81 connected to the planar electrode 510. Therefore, when a bonding position of the bump electrode 70 (121) deviates, a distance between the bump electrode 70 (121) and the via conductor 81 closest to the bump electrode 70 (121) varies. Therefore, the parasitic inductance generated between the bump electrode 70 (121) and the planar electrode 440 of the electrode layer L44 connected to the ground greatly varies.

In contrast, in a case of the multiplexer 1 according to the present example embodiment, as shown in FIG. 7A, the bump electrode 70 (121) is located between two via conductors 81$a$ and 81$b$ in the plurality of via conductors 81. Therefore, even when the bonding position of the bump electrode 70 (121) varies, the distance between the bump electrode 70 (121) and the via conductor 81$b$ decreases when the distance between the bump electrode 70 (121) and the via conductor 81$a$ increases. In this manner, variations in the parasitic inductance defined by parallel connection of the parasitic inductance generated in the path that connects the bump electrode 70 (121) and the via conductor 81$a$ and the parasitic inductance generated in the path that connects the bump electrode 70 (121) and the via conductor 81$b$ are reduced or prevented.

Figure 8A:
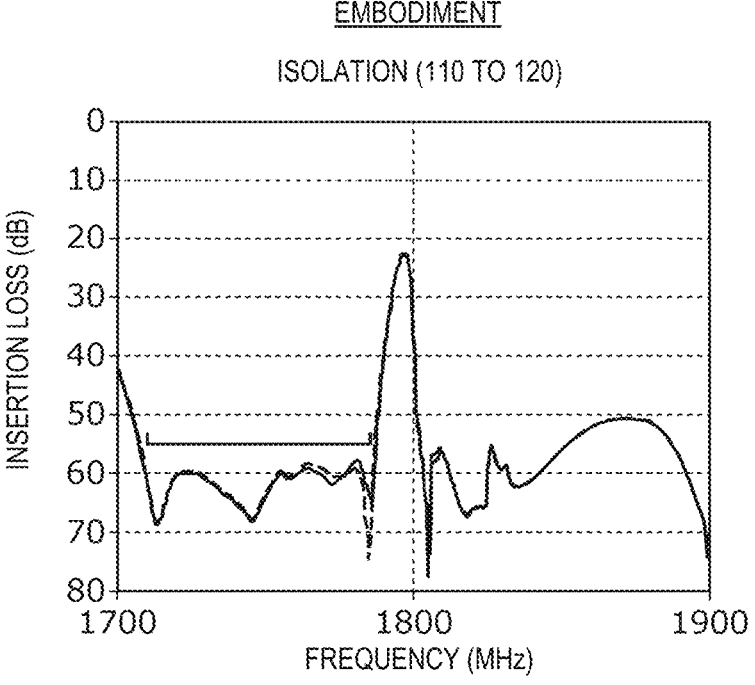
FIG. 8A is a graph showing isolation characteristics of a multiplexer according to an example embodiment of the present invention.
Figure 8B:
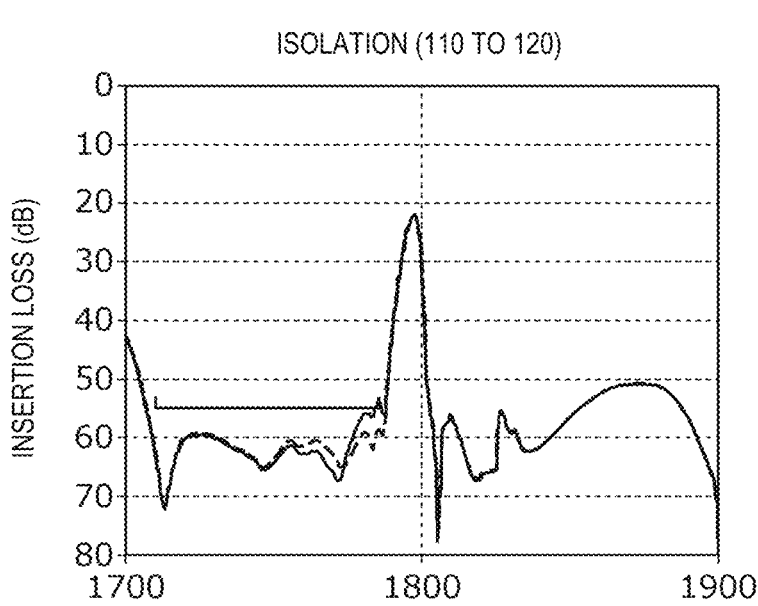
FIG. 8B is a graph showing isolation characteristics of a multiplexer according to a comparative example.

FIG. 8A is a graph showing isolation characteristics of the multiplexer 1 according to the present example embodiment. In addition, FIG. 8B is a graph showing isolation characteristics of the multiplexer according to the comparative example. The multiplexer according to the comparative example is different from the multiplexer 1 according to the present example embodiment only in that the planar electrode 410 of the filter 20 is replaced with the planar electrode 510.

Each of FIGS. 8A and 8B shows two types of waveform data (solid line and broken line). In both of FIGS. 8A and 8B, solid line waveform data is data when the position of the bump electrode 70 (121) deviates by about +30 μm in the y-axis positive direction with respect to broken line waveform data.

In the multiplexer 1 according to the present example embodiment, the isolation of the pass band of the filter 10 is, for example, about 58.5 dB when there is no positional deviation (broken line data in FIG. 8A), and is, for example, about 58.0 dB when there is positional deviation (solid line data in FIG. 8A). Therefore, the isolation shows a deterioration of, for example, about 0.5 dB.

On the other hand, in the multiplexer according to the comparative example, the isolation of the pass band of the filter 10 is, for example, about 58.4 dB when there is no positional deviation (broken line data in FIG. 8B), and is, for example, about 54.1 dB when there is positional deviation (solid line data in FIG. 8B). Therefore, the isolation shows a deterioration of, for example, about 4.3 dB.

As described above, in the multiplexer 1 according to the present example embodiment, compared to the multiplexer according to the comparative example, even when there is a deviation in the bonding position of the bump electrode to connect the parallel arm resonator having the highest resonant frequency to the ground when the filter chip 2 is face-down bonded to the multilayer substrate 40, variations in the parasitic inductance generated between the parallel arm resonator and the ground are reduced or prevented. Therefore, the isolation on the high frequency side of the pass band of the filter 10 can be improved. In other words, compared to the filter according to the comparative example, the filter 20 according to the present example embodiment can improve attenuation characteristics in the vicinity of the low frequency side of the pass band of the filter 20. Therefore, it is possible to provide the filter 20 and the multiplexer 1 in which the deterioration in the bandpass characteristics is reduced or prevented.

In addition, in the filter 20 according to the present example embodiment, as shown in FIG. 1, the parallel arm resonator p21 is connected to the path that connects the input terminal 102 and the series arm resonator s22 and to the terminal 121, and the parallel arm resonator p22 is connected to the path that connects the output terminal 120 and the series arm resonator s22 and to the terminal 121. That is, as shown in FIG. 3, the parallel arm resonators p21 and p22 are connected to the ground with the common bump electrode 70 (121) interposed therebetween.

As electrostatic capacitance Cp increases, in the resonant frequency ($=1/2\pi\sqrt{(LpCp)}$) of the parallel arm resonator, the resonant frequency is likely to vary even when parasitic inductance Lp slightly varies. Therefore, it is effective to reduce the electrostatic capacitance Cp to reduce or prevent the variations in the resonant frequency. However, it is necessary to reduce the number of the bump electrodes 70 connected to the ground to achieve a miniaturized filter chip, and the plurality of parallel arm resonators need to be connected to the common bump electrode 70. In this manner, in the multiplexer according to the related art (comparative example), synthetic electrostatic capacitance Cp of the parallel arm resonators p21 and p22 connected to one bump electrode 70 increases, and the resonant frequency greatly varies even when the parasitic inductance Lp slightly varies. Consequently, there is an issue in that both the miniaturized filter chip and the reduced or prevented characteristic variations cannot be achieved.

In contrast, according to the multiplexer 1 and the filter 20 in the present example embodiment, even when the synthetic electrostatic capacitance Cp of the parallel arm resonators p21 and p22 connected to one bump electrode 70 (121) increases, the variations in the parasitic inductance Lp due to the positional deviation of the bump electrode 70 (121) can be reduced or prevented. Therefore, it is possible to reduce or prevent the variations in the attenuation characteristics on the low frequency side with respect to the pass band of the filter 20 defined by the parallel arm resonator p21 having the highest resonant frequency in the plurality of parallel arm resonators. Therefore, it is possible to provide the miniaturized filter 20 and the multiplexer 1 in which the deterioration in the bandpass characteristics is reduced or prevented.

In addition, in the multiplexer 1 according to the present example embodiment, as shown in FIG. 7A, in a plan view of the main surface 40a, the bump electrode 70 (121) is located between two via conductors 81a and 81b in the plurality of via conductors 81 connected to the planar electrode 410, and is located between two via conductors 81c and 81d located on a virtual straight line intersecting a virtual line segment connecting the two via conductors 81a and 81b.

According to this configuration, the variations in the parasitic inductance can be reduced or prevented not only when the bonding position of the bump electrode 70 (121) deviates in a direction along the virtual line connecting the via conductors 81a and 81b in a plan view of the main surface 40a, but also when the bonding position deviates in a direction along the virtual line connecting the via conductors 81c and 81d.

In addition, as shown in FIG. 3, in the multiplexer 1 according to the present example embodiment, eight bump electrodes 70 are disposed on the main surface 50a. In the eight bump electrodes 70, the bump electrode 70 (113) (second bump electrode) and the bump electrode 70 (120) (third bump electrode) are disposed in both end portions of the outer edge of the piezoelectric substrate 50 in a plan view of the main surface 50a. In contrast, the bump electrode 70 (121) is located between the bump electrode 70 (113) and the bump electrode 70 (120) in a plan view of the main surface 50a. In other words, the bump electrode 70 (121) is disposed in a region excluding a corner portion of the piezoelectric substrate 50. Since a distance between the bump electrode disposed in the corner portion of the piezoelectric substrate 50 and the center of the piezoelectric substrate 50 is long, a position variation distance of the bump electrode increases compared to position variations in a rotation direction of the piezoelectric substrate 50. Therefore, the variations in the parasitic inductance increase. Therefore, the bump electrode 70 (121) connected to the parallel arm resonator p21 having the highest resonant frequency in the plurality of parallel arm resonators is disposed in the region excluding the corner portion of the piezoelectric substrate 50, that is, a region close to the center of the piezoelectric substrate 50. In this manner, it is possible to effectively reduce or prevent characteristic variations caused by not only the positional deviation in the x-axis and y-axis directions but also the positional deviation in the rotation direction.

In addition, in the filter 20 according to the present example embodiment, as shown in Table 1, the parallel arm resonator p21 has the smallest electrostatic capacitance in the plurality of parallel arm resonators.

The parallel arm resonator p21 having the highest resonant frequency in the plurality of parallel arm resonators has the highest impedance on the low frequency side inside the pass band. In the parallel arm resonator, as the impedance is higher, the insertion loss in the pass band can be reduced. Therefore, the impedance can be increased by reducing or minimizing the electrostatic capacitance of the parallel arm resonator p21, and the insertion loss in the pass band can be improved.

The electrostatic capacitance of the surface acoustic wave resonator is proportional to (number of pairs×cross width) of the IDT electrode. Therefore, as a method of specifying the parallel arm resonator having the smallest electrostatic capacitance in the plurality of parallel arm resonators, the magnitudes of (number of pairs×cross width) of the IDT electrodes may be compared.

In addition, in the filter 20 according to the present example embodiment, the parallel arm resonator p23 includes the piezoelectric substrate 50, the IDT electrode (third functional electrode: shown as p23 in FIG. 3) disposed on the main surface 50a, and the bump electrode 70 (122) (fourth bump electrode) connected to the IDT electrode. In addition, as shown in FIG. 5, the multilayer substrate 40 includes a planar electrode 411 (fifth planar electrode) disposed on the electrode layer L41 and bonded to the bump electrode 70 (122), the planar electrode 444 (sixth planar electrode) disposed on the electrode layer L44 and connected to the ground, and the inductor 33 (disposed on the electrode layer L42) connected between the planar electrode 411 and the planar electrode 444.

In the parallel arm resonator p23, the ground is isolated from the parallel arm resonator p21 having the highest resonant frequency inside the multiplexer 1, and the parallel arm resonator p23 is connected to the ground via the bump electrode 70 (122) different from the bump electrode 70 (121) and the inductor 33. Since the inductor 33 is connected to the parallel arm resonator p23, an interval between the resonant frequency and the anti-resonant frequency of the parallel arm resonator p23 is widened, and an attenuation pole due to the resonant frequency of the parallel arm resonator p23 can be located on the low frequency side inside the pass band of the filter 10. Therefore, it is possible to provide the filter 20 in which the attenuation characteristics are improved over a wide band on the low frequency side with respect to the pass band of the filter 20.

In addition, since the parallel arm resonator p24 is connected to the bump electrode 70 (122) together with the parallel arm resonator p23, the synthetic electrostatic capacitance of the parallel arm resonators p23 and p24 increases, and an inductance value for obtaining a predetermined resonant frequency can be reduced. In this manner, since a line width of the inductor 33 provided inside the multilayer substrate 40 can be increased, variations in the inductance value of the inductor 33 can be reduced or prevented. Therefore, it is possible to provide the small filter 20 in which the attenuation characteristics are improved and the small multiplexer 1 in which the isolation characteristics are improved.

5. Advantageous Effects

As described above, the filter 20 according to the present example embodiment includes the series arm resonator s21 disposed in the series arm path that connects the input terminal 102 and the output terminal 120, the plurality of parallel arm resonators p21 to p24 connected between the series arm path and the ground, the multilayer substrate 40 including the main surfaces 40a and 40b facing each other and the plurality of dielectric layers, the piezoelectric substrate 50 including the main surface 50a facing the main surface 40a, and the bump electrode 70 (121) disposed on the main surface 50a. The series arm resonator s21 includes the first functional electrode disposed on the main surface 50a. The parallel arm resonator p21 in the plurality of parallel arm resonators p21 to p24 includes the second functional electrode disposed on the main surface 50a. The bump electrode 70 (121) is connected to the second functional electrode. The multilayer substrate 40 includes the planar electrode 410 disposed on the first dielectric layer in the plurality of dielectric layers and bonded to the bump electrode 70 (121), the planar electrode 440 disposed on the second dielectric layer on the main surface 40b side with respect to the first dielectric layer in the plurality of dielectric layers and connected to the ground, and the plurality of via conductors 81 that connect the planar electrode 410 and the planar electrode 440. In a plan view of the main surface 40a, the bump electrode 70 (121) is located between two via conductors 81a and 81b in the plurality of via conductors 81 connected to the planar electrode 410. The parallel arm resonator p21 has the highest resonant frequency in the plurality of parallel arm resonators p21 to p24.

According to this configuration, when the filter chip 2 is face-down bonded to the multilayer substrate 40, even when there is a deviation in the bonding position of the bump electrode 70 (121) to connect the parallel arm resonator p21 having the highest resonant frequency to the ground, the variations in the parasitic inductance generated between the parallel arm resonator p21 and the ground are reduced or prevented. In this manner, the attenuation characteristics on the low frequency side with respect to the pass band of the filter 20 can be improved, and the isolation characteristics on the high frequency side of the pass band of the filter 10 in the multiplexer 1 can be improved. Therefore, it is possible to provide the filter 20 and the multiplexer 1 in which the deterioration in the bandpass characteristics is reduced or prevented.

In addition, for example, in the filter 20, the second substrate is the piezoelectric substrate 50, and each of the first functional electrode and the second functional electrode is the IDT electrode.

According to this configuration, it is possible to reduce or prevent the deterioration in the bandpass characteristics of the filter 20 that performs electromechanical conversion by using the surface acoustic wave.

In addition, for example, in the filter 20, each of the first functional electrode and the second functional electrode includes the lower electrode 66, the piezoelectric body layer 67, and the upper electrode 68 in order from the main surface 40a.

According to this configuration, it is possible to reduce or prevent the deterioration in the bandpass characteristics of the filter 20 that performs electromechanical conversion by using the bulk acoustic wave.

In addition, the filter 20 according to the present example embodiment includes the series arm resonator s21 disposed in the series arm path that connects the input terminal 102 and the output terminal 120, the plurality of parallel arm resonators p21 to p24 connected between the series arm path and the ground, the multilayer substrate 40 including main surfaces 40a and 40b facing each other and the plurality of dielectric layers, the piezoelectric substrate 50 including the main surface 50a facing the main surface 40a, and the bump electrode 70 (121) disposed on the main surface 50a. The series arm resonator s21 includes the first functional electrode disposed on the main surface 50a. The parallel arm resonator p21 in the plurality of parallel arm resonators p21 to p24 includes the second functional electrode disposed on the main surface 50a. The bump electrode 70 (121) is connected to the second functional electrode. The multilayer substrate 40 includes the planar electrode 410 disposed on the first dielectric layer in the plurality of dielectric layers and bonded to the bump electrode 70 (121), the planar electrode 440 disposed on the second dielectric layer on the main surface 40b side with respect to the first dielectric layer in the plurality of dielectric layers and connected to the ground, and the plurality of via conductors 81 that connect the planar electrode 410 and the planar electrode 440. In a plan view of the main surface 40a, the bump electrode 70 (121) is located between two via conductors 81a and 81b in the plurality of via conductors 81 connected to the planar electrode 410. Each of the first functional electrode and the second functional electrode is the IDT electrode. The parallel arm resonator p21 has the smallest electrode finger pitch of the IDT electrode in the plurality of parallel arm resonators p21 to p24.

According to this configuration, when the filter chip 2 is face-down bonded to the multilayer substrate 40, even when there is a deviation in the bonding position of the bump electrode 70 (121) to connect the parallel arm resonator p21 having the highest resonant frequency to the ground, the variations in the parasitic inductance generated between the parallel arm resonator p21 and the ground are reduced or prevented. In this manner, the attenuation characteristics on the low frequency side with respect to the pass band of the filter 20 can be improved, and the isolation characteristics on the high frequency side of the pass band of the filter 10 in the multiplexer 1 can be improved. Therefore, it is possible to provide the filter 20 and the multiplexer 1 in which the deterioration in the bandpass characteristics is reduced or prevented.

In addition, for example, the filter 20 includes the parallel arm resonators p21 and p22. The parallel arm resonator p21 is connected to the path that connects the input terminal 102 and the series arm resonator s22 and to the bump electrode 70 (121). The parallel arm resonator p22 is connected to the path that connects the output terminal 120 and the series arm resonator s22 and to the bump electrode 70 (121).

According to this configuration, even when the synthetic electrostatic capacitance Cp of the parallel arm resonators p21 and p22 connected to one bump electrode 70 (121) increases, the variations in the parasitic inductance Lp due to the positional deviation of the bump electrode 70 (121) can be reduced or prevented. In this manner, it is possible to reduce or prevent the variations in the attenuation characteristics on the low frequency side with respect to the pass band of the filter 20 defined by the parallel arm resonator p21 having the highest resonant frequency in the plurality of parallel arm resonators. Therefore, it is possible to provide the small filter 20 in which the deterioration in the bandpass characteristics is reduced or prevented.

In addition, for example, in the filter 20, the planar electrode 410 is disposed on the main surface 40a.

In addition, for example, in the filter 20, the planar electrode 440 is disposed on the main surface 40b.

In addition, for example, in the filter 20, the planar electrode 440 is the external connection terminal.

In addition, for example, in the filter 20, in a plan view of the main surface 40a, the bump electrode 70 (121) is located between two via conductors 81a and 81b in the plurality of via conductors 81 connected to the planar electrode 410, and is located between two via conductors 81c and 81d located on the virtual straight line intersecting the virtual line segment connecting the two via conductors 81a and 81b.

According to this configuration, the variations in the parasitic inductance can be reduced or prevented not only when the bonding position of the bump electrode 70 (121) deviates in a direction along the virtual line connecting the via conductors 81a and 81b in a plan view of the main surface 40a, but also when the bonding position deviates in a direction along the virtual line connecting the via conductors 81c and 81d.

In addition, for example, in the filter 20, the plurality of bump electrodes 70 including the bump electrode 70 (121) are disposed on the main surface 40a. The bump electrode 70 (113) and the bump electrode 70 (120) in the plurality of bump electrodes 70 are disposed in both end portions of the outer edge of the piezoelectric substrate 50 in a plan view of the main surface 40a. The bump electrode 70 (121) is located between the bump electrode 70 (113) and the bump electrode 70 (120) in a plan view of the main surface 40a.

According to this configuration, the bump electrode 70 (121) connected to the parallel arm resonator p21 having the highest resonant frequency in the plurality of parallel arm resonators p21 to p24 is disposed in the region excluding the corner portion of the piezoelectric substrate 50, that is, the region close to the center of the piezoelectric substrate 50. In this manner, it is possible to effectively reduce or prevent characteristic variations caused by not only the positional deviation in the x-axis and y-axis directions of the bump electrode 70 (121) but also the positional deviation in the rotation direction of the bump electrode 70 (121).

In addition, for example, in the filter 20, the parallel arm resonator p21 has the smallest electrostatic capacitance in the plurality of parallel arm resonators p21 to p24.

The parallel arm resonator p21 having the highest resonant frequency in the plurality of parallel arm resonators p21 to p24 has the lowest impedance on the low frequency side inside the pass band. In the parallel arm resonator, as the impedance increases, the insertion loss in the pass band can be reduced. According to this configuration, the impedance can be increased by reducing or minimizing the electrostatic capacitance of the parallel arm resonator p21, and the insertion loss in the pass band of the filter 20 can be improved.

In addition, for example, in the filter 20, the parallel arm resonator p23 includes the piezoelectric substrate 50, the IDT electrode disposed on the main surface 50a, and the bump electrode 70 (122) disposed on the main surface 50a and connected to the IDT electrode. The multilayer substrate 40 further includes the planar electrode 411 disposed on the dielectric layer closest to the main surface 40a side in the plurality of dielectric layers and bonded to the bump electrode 70 (122), the planar electrode 444 disposed on the dielectric layer closest to the main surface 40b side in the plurality of dielectric layers and connected to the ground, and the inductor 33 connected between the planar electrode 411 and the planar electrode 444.

According to this configuration, since the inductor 33 is connected to the parallel arm resonator p23, the interval between the resonant frequency and the anti-resonant frequency of the parallel arm resonator p23 is widened, and the attenuation pole due to the resonant frequency of the parallel arm resonator p23 can be located on the low frequency side inside the pass band of the filter 10. Therefore, the attenuation characteristics can be improved over the wide band on the low frequency side with respect to the pass band of the filter 20.

In addition, the multiplexer 1 according to the present example embodiment includes the common terminal 100, the filter 20 in which the input terminal 102 is connected to the common terminal 100, and the filter 10 connected to the common terminal 100 and in which the pass band is located on the low frequency side with respect to the filter 20.

According to this configuration, it is possible to provide the multiplexer 1 in which the deterioration in the isolation characteristics on the high frequency side of the pass band of the filter 10 is reduced or prevented.

OTHER EXAMPLE EMBODIMENTS

Hitherto, an acoustic wave device and a multiplexer according to example embodiments of the present invention have been described, but the present invention is not limited to the above-described example embodiments. The present invention also includes modified examples obtained such that those skilled in the art modify the above-described example embodiments in various ways within the scope of the present invention, or various devices including acoustic wave devices and/or multiplexers according to example embodiments of the present invention.

In addition, for example, in the acoustic wave device and the multiplexer according to the above-described example embodiment, matching elements such as an inductor and a capacitor, and a switch circuit may be connected between respective configuration elements.

For example, the resonant frequency and the anti-resonant frequency described in the above-described example embodiment are derived by bringing an RF probe into contact with two input/output electrodes of the acoustic wave resonator to measure reflection characteristics.

Example embodiments of the present invention can be widely used for communication equipment such as, for example, a mobile phone, as acoustic wave devices or multiplexers each having low loss and high attenuation, which is applicable to a multi-band frequency standard.

While example embodiments of the present invention have been described above, it is to be understood that variations and modifications will be apparent to those skilled in the art without departing from the scope and spirit of the present invention. The scope of the present invention, therefore, is to be determined solely by the following claims.

What is claimed is:

1. An acoustic wave device comprising:
a first series arm resonator in a series arm path connecting a first input/output terminal and a second input/output terminal;
a plurality of parallel arm resonators connected between the series arm path and a ground;
a first substrate including a first main surface and a second main surface facing each other, and a plurality of dielectric layers;
a second substrate including a third main surface facing the first main surface; and
a first bump electrode on the third main surface; wherein
the first series arm resonator includes a first functional electrode on the third main surface;
a first parallel arm resonator of the plurality of parallel arm resonators includes a second functional electrode on the third main surface;
the first bump electrode is connected to the second functional electrode;
the first substrate includes:
a first planar electrode on a first dielectric layer of the plurality of dielectric layers and bonded to the first bump electrode;
a second planar electrode on a second dielectric layer of the plurality of dielectric layers on a side of the second main surface with respect to the first dielectric layer and connected to the ground; and
a plurality of via conductors connecting the first planar electrode and the second planar electrode;
in a plan view of the first main surface, the first bump electrode is located between two via conductors of the plurality of via conductors connected to the first planar electrode; and
the first parallel arm resonator has a highest resonant frequency of the plurality of parallel arm resonators.

2. The acoustic wave device according to claim 1, wherein the second substrate has piezoelectricity, and each of the first functional electrode and the second functional electrode is an interdigital transducer electrode.

3. The acoustic wave device according to claim 1, wherein each of the first functional electrode and the second functional electrode includes a third planar electrode, a piezo-electric thin film, and a fourth planar electrode in order from the third main surface.

4. The acoustic wave device according to claim 1, wherein the plurality of parallel arm resonators include the first parallel arm resonator and a second parallel arm resonator;

the first parallel arm resonator is connected to a path that connects the first input/output terminal and the first series arm resonator, and is connected to the first bump electrode; and
the second parallel arm resonator is connected to a path that connects the second input/output terminal and the first series arm resonator, and is connected to the first bump electrode.

5. The acoustic wave device according to claim 1, wherein the first planar electrode is provided on the first main surface.

6. The acoustic wave device according to claim 1, wherein the second planar electrode is provided on the second main surface.

7. The acoustic wave device according to claim 6, wherein the second planar electrode is an external connection terminal.

8. The acoustic wave device according to claim 1, wherein, in a plan view of the first main surface, the first bump electrode is located between the two via conductors connected to the first planar electrode, and is located between two other via conductors of the plurality of via conductors located on a virtual straight line intersecting a virtual line segment connecting the two via conductors.

9. The acoustic wave device according to claim 1, wherein
a plurality of bump electrodes including the first bump electrode are provided on the third main surface;
a second bump electrode and a third bump electrode of the plurality of bump electrodes are provided in both end portions of an outer edge of the second substrate in a plan view of the third main surface; and
the first bump electrode is located between the second bump electrode and the third bump electrode in the plan view of the third main surface.

10. The acoustic wave device according to claim 1, wherein the first parallel arm resonator has a smallest electrostatic capacitance of the plurality of parallel arm resonators.

11. The acoustic wave device according to claim 1, wherein
the plurality of parallel arm resonators include the first parallel arm resonator and a third parallel arm resonator;
the third parallel arm resonator includes:
the second substrate;
a third functional electrode on the third main surface; and
a fourth bump electrode on the third main surface and connected to the third functional electrode; and
the first substrate further includes:
a fifth planar electrode on a dielectric layer of the plurality of dielectric layers closest to a side of the first main surface and bonded to the fourth bump electrode;
a sixth planar electrode on a dielectric layer of the plurality of dielectric layers closest to a side of the second main surface and connected to the ground; and
an inductor connected between the fifth planar electrode and the sixth planar electrode.

12. A multiplexer comprising:
a common terminal;
the acoustic wave device according to claim 1 in which the first input/output terminal is connected to the common terminal; and a filter connected to the common terminal and having a
pass band located on a low frequency side with respect
to the acoustic wave device.

13. An acoustic wave device comprising:

a first series arm resonator in a series arm path connecting
a first input/output terminal and a second input/output
terminal;

a plurality of parallel arm resonators connected between
the series arm path and a ground;

a first substrate including a first main surface and a second
main surface facing each other, and a plurality of
dielectric layers;

a second substrate including a third main surface facing
the first main surface; and a first bump electrode on the third main surface; wherein the first series arm resonator includes a first functional
electrode on the third main surface;

a first parallel arm resonator of the plurality of parallel
arm resonators includes a second functional electrode
on the third main surface;

the first bump electrode is connected to the second
functional electrode;

the first substrate includes:

a first planar electrode on a first dielectric layer of the
plurality of dielectric layers and bonded to the first
bump electrode;

a second planar electrode on a second dielectric layer of
the plurality of dielectric layers on a side of the
second main surface with respect to the first dielec-
tric layer and connected to the ground; and a plurality of via conductors connecting the first planar
electrode and the second planar electrode;

in a plan view of the first main surface, the first bump
electrode is located between two via conductors of the
plurality of via conductors connected to the first planar
electrode;

each of the first functional electrode and the second
functional electrode is an interdigital transducer elec-
trode; and the first parallel arm resonator has a smallest electrode
finger pitch of the interdigital transducer electrode of
the plurality of parallel arm resonators.

14. The acoustic wave device according to claim 13,
wherein the plurality of parallel arm resonators include the first
parallel arm resonator and a second parallel arm reso-
nator;

the first parallel arm resonator is connected to a path that
connects the first input/output terminal and the first
series arm resonator, and is connected to the first bump
electrode; and the second parallel arm resonator is connected to a path
that connects the second input/output terminal and the
first series arm resonator, and is connected to the first
bump electrode.

15. The acoustic wave device according to claim 13,
wherein the first planar electrode is provided on the first
main surface.

16. The acoustic wave device according to claim 13,
wherein the second planar electrode is provided on the
second main surface.

17. The acoustic wave device according to claim 16,
wherein the second planar electrode is an external connec-
tion terminal.

18. The acoustic wave device according to claim 13,
wherein, in a plan view of the first main surface, the first
bump electrode is located between the two via conductors
connected to the first planar electrode, and is located
between two other via conductors of the plurality of via
conductors located on a virtual straight line intersecting a
virtual line segment connecting the two via conductors.

19. The acoustic wave device according to claim 13,
wherein a plurality of bump electrodes including the first bump
electrode are provided on the third main surface;

a second bump electrode and a third bump electrode of the
plurality of bump electrodes are provided in both end
portions of an outer edge of the second substrate in a
plan view of the third main surface; and the first bump electrode is located between the second
bump electrode and the third bump electrode in the plan
view of the third main surface.

20. The acoustic wave device according to claim 13,
wherein the first parallel arm resonator has a smallest
electrostatic capacitance of the plurality of parallel arm
resonators.

21. The acoustic wave device according to claim 13,
wherein the plurality of parallel arm resonators include the first
parallel arm resonator and a third parallel arm resona-
tor;

the third parallel arm resonator includes:

the second substrate;

a third functional electrode on the third main surface;
and a fourth bump electrode on the third main surface and
connected to the third functional electrode; and the first substrate further includes:

a fifth planar electrode on a dielectric layer of the
plurality of dielectric layers closest to a side of the
first main surface and bonded to the fourth bump
electrode;

a sixth planar electrode on a dielectric layer of the
plurality of dielectric layers closest to a side of the
second main surface and connected to the ground;
and an inductor connected between the fifth planar electrode
and the sixth planar electrode.

22. A multiplexer comprising:

a common terminal;

the acoustic wave device according to claim 13 in which
the first input/output terminal is connected to the com-
mon terminal; and a filter connected to the common terminal and having a
pass band located on a low frequency side with respect
to the acoustic wave device.

* * * * *